(12) United States Patent
Hu et al.

(10) Patent No.: US 11,093,072 B2
(45) Date of Patent: Aug. 17, 2021

(54) TOUCH DISPLAY PANEL, METHOD OF DRIVING AND MANUFACTURING SAME, AND TOUCH DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zuquan Hu, Beijing (CN); Xiaoye Ma, Beijing (CN); Rui Ma, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/335,807

(22) PCT Filed: Apr. 28, 2018

(86) PCT No.: PCT/CN2018/084993
§ 371 (c)(1),
(2) Date: Mar. 22, 2019

(87) PCT Pub. No.: WO2019/041860
PCT Pub. Date: Mar. 7, 2019

(65) Prior Publication Data
US 2019/0227671 A1    Jul. 25, 2019

(30) Foreign Application Priority Data
Aug. 30, 2017  (CN) .......................... 201710764392.2

(51) Int. Cl.
*G06F 3/044* (2006.01)
*G06F 3/041* (2006.01)
*H01L 29/423* (2006.01)

(52) U.S. Cl.
CPC .......... *G06F 3/04164* (2019.05); *G06F 3/044* (2013.01); *G06F 3/0412* (2013.01);
(Continued)

(58) Field of Classification Search
CPC ........ G06F 3/044; G06F 3/047; G06F 3/0446; G06F 3/0412; G06F 3/0443;
(Continued)

(56) References Cited

U.S. PATENT DOCUMENTS

2014/0347317 A1* 11/2014 Tanaka ................. G06F 3/0446
345/174
2016/0018935 A1  1/2016 Wei et al.
(Continued)

FOREIGN PATENT DOCUMENTS

| CN | 104852068 A | 8/2015 |
| CN | 204706018 U | 10/2015 |

(Continued)

OTHER PUBLICATIONS

First Office Action for Chinese Patent Application No. 201710764392.2 dated Mar. 29, 2019.
(Continued)

*Primary Examiner* — Nitin Patel
*Assistant Examiner* — Amen W. Bogale
(74) *Attorney, Agent, or Firm* — Calfee, Halter & Griswold LLP (57) ABSTRACT

A touch display panel includes a plurality of gate lines extending in a first direction; a plurality of data lines extending in a second direction intersecting the first direction; and a plurality of pixels at intersections of the gate lines
(Continued)

and the data lines. Each of the pixels includes a pixel electrode and a common electrode opposite to the pixel electrode. The common electrodes are distributed in a plurality of touch regions arranged in an array and independent of each other. Each of the touch regions includes at least one connecting line extending in the first direction and a respective touch signal line electrically connected to the at least one connecting line and extending in the second direction. Each of the at least one connecting line electrically connects together respective ones of the plurality of common electrodes.

10 Claims, 8 Drawing Sheets

(52) U.S. Cl.
CPC .......... *G06F 3/0443* (2019.05); *G06F 3/0446* (2019.05); *G06F 3/04166* (2019.05); *H01L 29/42384* (2013.01); *G06F 3/04184* (2019.05); *G06F 2203/04103* (2013.01)

(58) Field of Classification Search
CPC .............. G06F 3/0416; G06F 3/04166; G06F 3/0445; G06F 3/04164; G06F 3/3655; G06F 3/0488; G06F 3/3696; G06F 3/0448; G06F 3/04184; G06F 3/041; G06F 2203/04103; G06F 2203/04111; G06F 2203/04112; G09G 2300/0426; G09G 3/3648; G09G 3/367–3696; G09G 3/3655; G09G 3/2085; G09G 2300/0439; G09G 2310/0208; G09G 2310/0297; G02F 1/1362; G02F 1/1343; G02F 1/1333; G02F 1/1338; G02F 1/136286; G02F 1/133345; G02F 1/134309; G02F 1/136227; G02F 2001/13629; G02F 2001/134318; G02F 2001/134372; G02F 2201/121; G02F 2201/123; H01L 27/3276; H01L 27/124; H01L 29/78696
See application file for complete search history.

(56) References Cited

U.S. PATENT DOCUMENTS

| | | | |
|---|---|---|---|
| 2016/0019827 A1* | 1/2016 | Lee | G09G 3/3208 345/204 |
| 2017/0068360 A1* | 3/2017 | Yuan | G06F 3/047 |
| 2017/0090239 A1* | 3/2017 | Jung | G06F 3/0412 |
| 2017/0147123 A1 | 5/2017 | Wang et al. | |
| 2017/0185209 A1 | 6/2017 | Yang et al. | |
| 2017/0192571 A1* | 7/2017 | Kim | G06F 3/04166 |
| 2017/0205955 A1 | 7/2017 | Yang et al. | |
| 2018/0113559 A1* | 4/2018 | Bae | G06F 3/0442 |
| 2018/0267665 A1* | 9/2018 | Fujisawa | G06F 3/041662 |
| 2019/0227671 A1 | 7/2019 | Hu et al. | |

FOREIGN PATENT DOCUMENTS

| | | |
|---|---|---|
| CN | 105094437 A | 11/2015 |
| CN | 105094479 A | 11/2015 |
| CN | 105094488 A | 11/2015 |
| CN | 205507719 U | 8/2016 |
| CN | 107515701 A | 12/2017 |

OTHER PUBLICATIONS

Search Report and Written Opinion for International Application No. PCT/CN2018/084993 dated Jul. 30, 2018.
Second Office Action for Chinese Patent Application No. 201710764392.2 dated Sep. 4, 2019.

* cited by examiner

TOUCH DISPLAY PANEL, METHOD OF DRIVING AND MANUFACTURING SAME, AND TOUCH DISPLAY DEVICE

CROSS-REFERENCE TO RELATED APPLICATIONS

The present application is the U.S. national phase entry of PCT/CN2018/084993, with an international filing date of Apr. 28, 2018, which claims the benefit of the Chinese Patent Application No. 201710764392.2, filed Aug. 30, 2017, the entire disclosures of which are incorporated herein by reference.

TECHNICAL FIELD

The present disclosure relates to the field of touch display technologies, and more particularly, to a touch display panel, a method of driving the touch display panel, a method of manufacturing the touch display panel, and a touch display device including the touch display panel.

BACKGROUND

In an in-cell touch display panel, touch sensors are embedded in a display panel. Depending on their working principle, the touch sensors can be classified into resistive sensors, capacitive sensors, optical sensors, and the like. Capacitive touch sensors are widely used in the industry due to their multi-point control capability and high sensitivity. Capacitive touch sensors typically include touch electrodes. In a typical application, some of the touch electrodes and/or their leads are arranged along a width direction of the touch display panel, requiring a space for arranging the leads on the left and right sides of the touch display panel.

SUMMARY

According to an exemplary embodiment of the present disclosure, a touch display panel is provided, comprising: a plurality of gate lines extending in a first direction; a plurality of data lines extending in a second direction intersecting the first direction; and a plurality of pixels at intersections of the gate lines and the data lines, each of the plurality of pixels comprising a respective pixel electrode and a respective common electrode opposite to the pixel electrode, the common electrodes being distributed in a plurality of touch regions that are arranged in an array and independent of each other. Each of the plurality of touch regions comprises at least one respective connecting line extending in the first direction and a respective touch signal line electrically connected to the at least one respective connecting line and extending in the second direction. Each of the at least one respective connecting line electrically connects together respective ones of the common electrodes.

In some embodiments, each of the plurality of touch regions comprises a plurality of the connecting lines.

In some embodiments, within each of the plurality of touch regions, at least two directly adjacent ones of the common electrodes are formed together as an integral piece.

In some embodiments, the connecting lines are equal in quantity to the touch signal lines, and each of the connecting lines is electrically connected to a respective one of the touch signal lines.

In some embodiments, the connecting lines are in a same layer as the gate lines, and the touch signal lines are in a same layer as the data lines.

In some embodiments, the touch display panel further comprises: a base substrate on which the pixel electrodes are; a plurality of thin film transistors at the intersections of the gate lines and the data lines, each of the plurality of thin film transistors comprising: a gate electrode on the base substrate and in the same layer as the gate lines, the gate electrode being electrically connected to a corresponding one of the gate lines; a gate insulating layer covering the base substrate, the pixel electrodes, the gate electrode, the gate lines, and the connecting lines; an active layer on the gate insulating layer and opposite to the gate electrode; a source electrode in contact with the active layer and in the same layer as the data lines, the source electrode being electrically connected to a corresponding one of the data lines; and a drain electrode in contact with the active layer and in the same layer as the data lines, the drain electrode being electrically connected to a respective one of the pixel electrodes; and a passivation layer covering the gate insulating layer, the source electrode, the drain electrode, the data lines, and the touch signal lines. The common electrodes are on the passivation layer.

In some embodiments, the touch display panel further comprises: a plurality of first vias, each extending through the passivation layer and the gate insulating layer to expose a respective one of the pixel electrodes and a respective one of the drain electrodes; a plurality of first conductive connections, each filling a respective one of the plurality of first vias to electrically connect a respective one of the pixel electrodes and a respective one of the drain electrodes; a plurality of second vias, each extending through the passivation layer to expose a corresponding one of the touch signal lines; a plurality of third vias, each extending through the passivation layer and the gate insulating layer to expose a respective one of the connecting lines; a plurality of second conductive connections, each filling a respective one of the second vias and a respective one of the third vias to electrically connect a corresponding one of the touch signal lines and a respective one of the connecting lines; and a plurality of fourth vias, each extending through the passivation layer and the gate insulating layer to expose a corresponding one of the connecting lines, each of the plurality of fourth vias being filled by a corresponding one of the common electrodes to provide an electrical connection between the corresponding one of the common electrodes and the corresponding one of the connecting lines.

In some embodiments, each of the common electrodes is electrically connected to a corresponding one of the connecting lines by at least two respective ones of the fourth vias.

According to another exemplary embodiment of the present disclosure, a touch display device is provided comprising the touch display panel as described above.

According to yet another exemplary embodiment of the present disclosure, a method of driving a touch display panel is provided. The touch display panel comprises a plurality of gate lines; a plurality of data lines intersecting the gate lines; and a plurality of pixels at intersections of the gate lines and the data lines, each of the pixels comprising a respective pixel electrode and a respective common electrode opposite to the respective pixel electrode, the common electrodes being distributed in a plurality of touch regions arranged in an array and independent of each other, each of the touch regions comprising at least one respective connecting line extending in a direction parallel to the gate lines and a respective touch signal line electrically connected to the at least one respective connecting line and extending in a direction parallel to the data lines, each of the at least one respective connecting line electrically connecting respective ones of the common electrodes together. The method comprises: performing alternately a display period and a touch period. In the display period, respective common voltages are applied to the touch signal lines. In the touch period, respective touch driving signals are sequentially applied to the touch signal lines and the respective touch driving signals on the touch signal lines are detected as respective touch sensing signals for respective ones of the touch regions.

In some embodiments, the method further comprises identifying one of the touch regions as a touch position in response to detection of a change in the touch sensing signal for the touch region relative to a standard signal.

In some embodiments, the change comprises at least one selected from a group consisting of the touch sensing signal being less than the standard signal at a first time and the touch sensing signal being greater than the standard signal at a second time.

According to still yet another exemplary embodiment of the present disclosure, a method of manufacturing a touch display panel is provided, comprising: providing a base substrate; forming, on the base substrate, a plurality of gate lines extending in a first direction, a plurality of connecting lines extending in the first direction, a plurality of pixel electrodes distributed in an array, and respective gate electrodes associated with respective ones of the plurality of pixel electrodes, wherein each of the gate electrodes is electrically connected to a corresponding one of the gate lines; forming a gate insulating layer covering the base substrate, the gate lines, the connecting lines, the pixel electrodes, and the gate electrodes; forming, on the gate insulating layer, respective active layers opposite to respective ones of the gate electrodes, respective source electrodes and drain electrodes in contact with respective ones of the active layers, a plurality of data lines extending in a second direction intersecting the first direction, and a plurality of touch signal lines extending in the second direction, wherein each of the data lines is electrically connected to respective ones of the source electrodes; forming a passivation layer covering the gate insulating layer, the data lines, the touch signal lines, the source electrodes, the drain electrodes, and the active layers; forming, on the passivation layer, a plurality of common electrodes opposite to the pixel electrodes, wherein the common electrodes are distributed in a plurality of touch regions that are arranged in an array and independent of each other, each of the touch regions comprising at least one of the connecting lines, each of the at least one of the connecting lines electrically connecting respective ones of the common electrodes together; providing electrical connections between respective ones of the pixel electrodes and respective ones of the drain electrodes; and providing, within each of the touch regions, an electrical connection between the at least one of the connecting lines and a respective one of the touch signal lines.

In some embodiments, the providing the electrical connections between the respective ones of the pixel electrodes and the respective ones of the drain electrodes comprises: forming a plurality of first vias, each extending through the passivation layer and the gate insulating layer to expose a respective one of the pixel electrodes and a respective one of the drain electrodes; and filling respective ones of the first vias with respective first conductive connections to electrically connect the respective ones of the pixel electrodes and the respective ones of the drain electrodes.

In some embodiments, the providing the electrical connection between the at least one of the connecting lines and the respective one of the touch signal lines comprises: forming a second via at a respective intersection of each of the at least one of the connecting lines and the respective one of the touch signal lines, wherein the second via extends through the passivation layer to expose the respective one of the touch signal lines; forming a third via at the respective intersection of each of the at least one of the connecting lines and the respective one of the touch signal lines, wherein the third via extends through the passivation layer and the gate insulating layer to expose the connecting line; and filling and electrically connecting the second via and the third via with a second conductive connection.

In some embodiments, the forming the plurality of common electrodes comprises: forming a plurality of fourth vias, each extending through the passivation layer and the gate insulating layer to expose a corresponding one of the connecting lines; and filling each of the fourth vias with a corresponding one of the common electrodes to provide an electrical connection between the corresponding one of the common electrodes and the corresponding one of the connecting lines.

In some embodiments, the forming the plurality of fourth vias further comprises providing respective two of the fourth vias for each of the common electrodes.

In some embodiments, the forming the plurality of common electrodes further comprises forming, within each of the touch regions, at least two directly adjacent ones of the common electrodes together as an integral piece.

These and other exemplary embodiments of the present disclosure will be apparent from and elucidated with reference to the embodiment(s) described hereinafter.

BRIEF DESCRIPTION OF THE DRAWINGS

The drawings are provided for an understanding of the present disclosure and form a part of this disclosure. In the drawing.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "lateral", "longitudinal", "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure are described in detail below with reference to the accompanying drawings.

Figure 1:
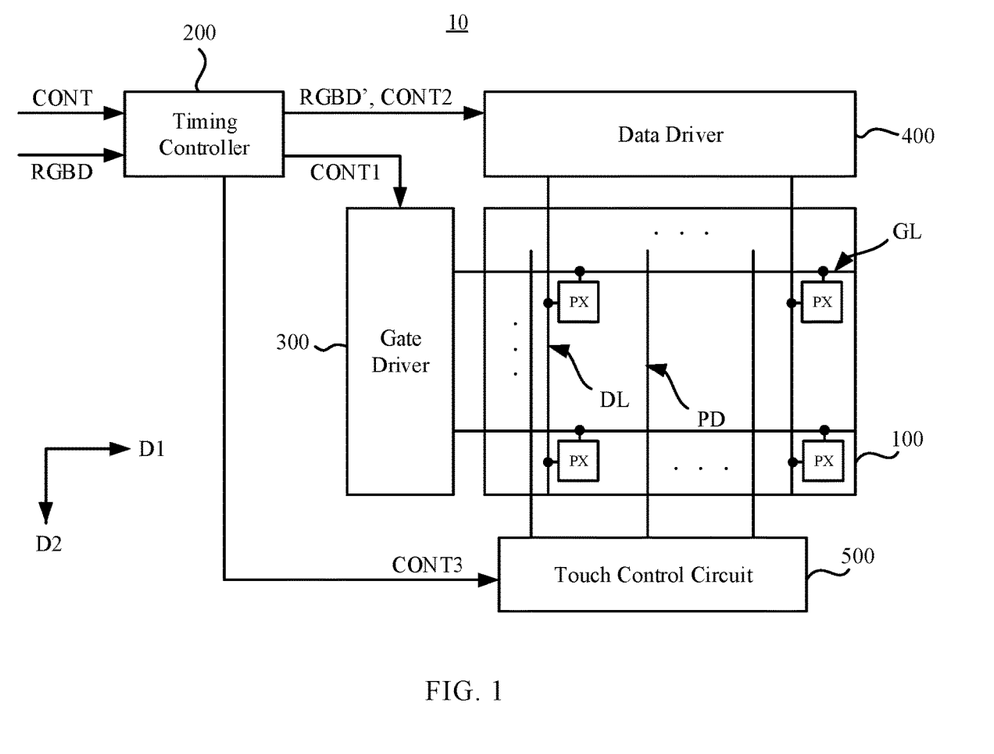
FIG. 1 is a schematic block diagram of a touch display device according to an embodiment of the present disclosure.

FIG. 1 is a block diagram of a touch display device 10 in accordance with an embodiment of the present disclosure. Referring to FIG. 1, the touch display device 10 includes a touch display panel 100, a timing controller 200, a gate driver 300, a data driver 400, and a touch control circuit 500.

The touch display panel 100 includes a plurality of gate lines GL, a plurality of data lines DL, and a plurality of touch signal lines PD. The gate lines GL extend in a first direction D1, and the data lines DL and the touch signal lines PD extend in a second direction D2 that intersects (e.g., is substantially perpendicular to) the first direction D1. The touch display panel 100 further includes a plurality of pixels PX arranged in an array, each of which is electrically connected to a corresponding one of the gate lines GL and a corresponding one of the data lines DL. Each of the pixels PX may include a pixel electrode and a common electrode (not shown in FIG. 1). The touch display panel 100 can be divided into a plurality of touch regions, as will be further described below.

The timing controller 200 controls the display panel 100, the gate driver 300, the data driver 400, and the touch control circuit 500. The timing controller 200 receives input image data RGBD and an input control signal CONT. The input image data RGBD includes input pixel data for the plurality of pixels. The input pixel data may include red gradation data R, green gradation data and blue gradation data B for a corresponding one of the plurality of pixels. The input control signal CONT may include a main clock signal, a data enable signal, a vertical sync signal, a horizontal sync signal, and the like. The timing controller 200 generates output image data RGBD', a first control signal CONT1, a second control signal CONT2, and a third control signal CONT3 based on the input image data RGBD and the input control signal CONT. The first control signal CONT1 may include a vertical enable signal, a gate clock signal, and the like. The second control signal CONT2 may include a horizontal enable signal, a data clock signal, a data load signal, a polarity control signal, and the like. The third control signal CONT3 can be used to instruct the touch control circuit 500 to operate in cooperation with the gate driver 300 and the data driver 400 in a display period and perform touch scan detection in a touch period.

The gate driver 300 receives the first control signal CONT1 from the timing controller 200. The gate driver 300 generates a plurality of gate driving signals for driving the gate lines GL based on the first control signal CONT1. The gate driver 300 may sequentially apply the plurality of gate driving signals to the gate lines GL.

The data driver 400 receives the second control signal CONT2 and the output image data RGBD' from the timing controller 200. The data driver 400 generates a plurality of data voltages based on the second control signal CONT2 and the output image data RGBD'. The data driver 400 may apply the plurality of data voltages to the data lines DL.

The touch control circuit 500 receives the third control signal CONT3 from the timing controller 200. In the display period, the touch control circuit 500 may supply respective common voltages to the common electrodes of the plurality of pixels PX via the touch signal lines PD. These common voltages can be equal or unequal. In the touch period, the touch control circuit 500 sequentially applies a touch driving signal to the touch signal lines PD, and identifies a touch position by detecting touch sensing signals on the touch signal lines PD, as will be described further below.

As shown intuitively in FIG. 1, in the touch display device 10, the touch signal lines PD extend to the bottom end of the touch display panel 100 to be connected to the touch control circuit 500 without being lead out on the left and right sides of the touch display panel 100. As a result, there is no need to reserve a space for arranging the leads on the left and right sides of the touch display panel 100, thereby facilitating a narrow bezel design.

Figure 2:
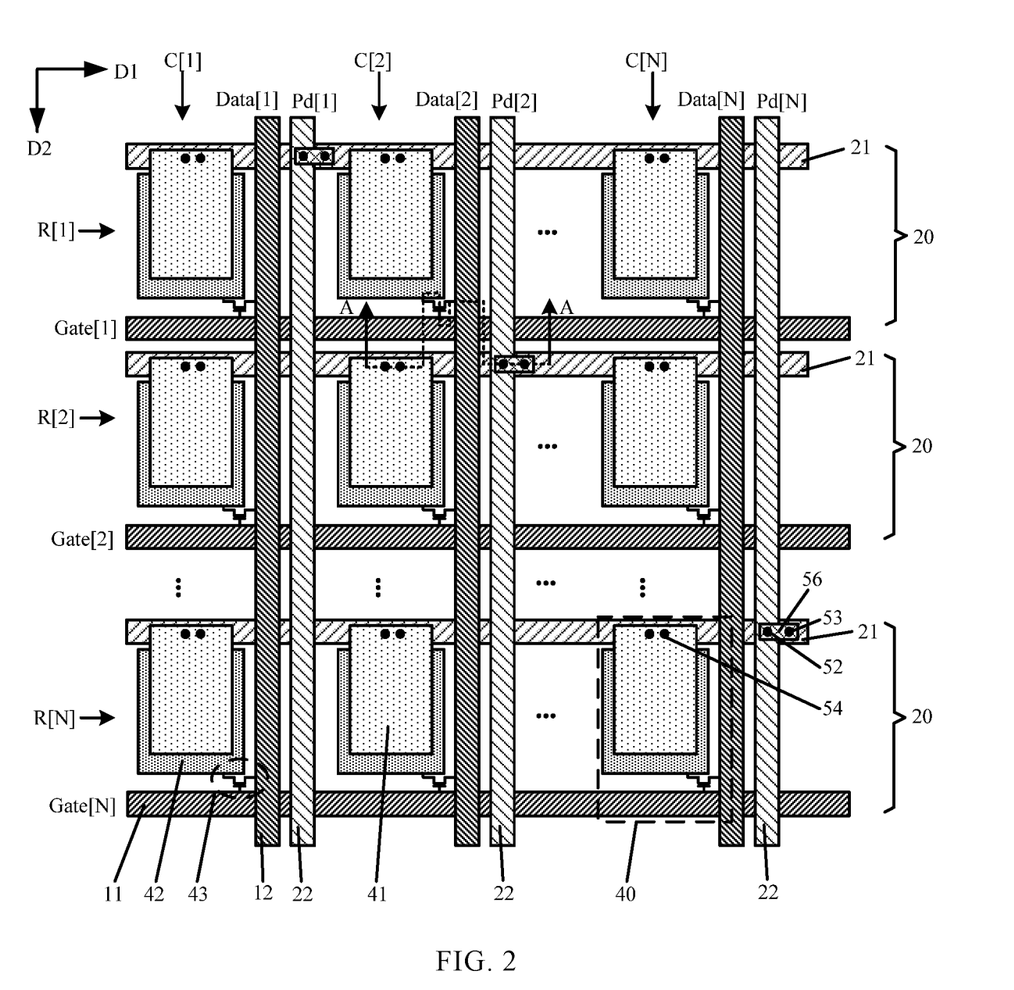
FIG. 2 is a schematic plan view showing a plurality of touch regions in a touch display panel according to an embodiment of the present disclosure.

FIG. 2 illustrates several example touch regions 20 in the touch display panel 100. Referring to FIG. 2, a plurality of gate lines Gate[1], Gate[2], . . . , Gate[N] extend in a first direction D1, and a plurality of data lines Data[1], Data[2], . . . , Data [N] and a plurality of touch signal lines Pd[1], Pd[2], . . . , Pd[N] extend in a second direction D2 intersecting the first direction D1. For convenience of description, the gate lines, data lines, and touch signal lines are also indicated by reference 11, 12, and 22, respectively. A plurality of pixels 40 are disposed at intersections of the gate lines 11 and the data lines 12, each of which includes a pixel electrode 42 and a common electrode 41 disposed opposite to the pixel electrode 42. In the example shown in FIG. 2, N×N pixels 40 are arranged in N rows R[1], R[2], . . . , R[N] and N columns C[1], C[2], . . . , C[N]. Each of the pixels 40 further includes a thin film transistor 43 disposed at an intersection of a corresponding one of the gate lines 11 and a corresponding one of the data lines 12, which thin film transistor 43 includes a gate connected to the corresponding gate line 11, a source connected to the corresponding data line 12 and a drain connected to the pixel electrode 42 of the pixel 40.

The common electrodes 41 are distributed in the plurality of touch regions 20. Each of the touch regions 20 further includes a connecting line 21 extending in the first direction D1 and a respective one of the touch signal lines 22 electrically connected to the connecting line 21 and extending in the second direction D2. FIG. 2 shows N touch regions 20 arranged in the second direction D2. It will be understood that although not shown, the touch regions 20 are arranged in an array in the touch display panel 100 (FIG. 1). That is, there are actually a plurality of touch regions 20 also arranged in the first direction D1. In this example, each of the connecting lines 21 electrically connects the N common electrodes 41 in the touch region 20 where it is located. The electrical connection between the connecting line 21 and the common electrodes 41 can be achieved by fourth vias 54. The touch regions 20 are independent of each other in that the connecting lines 21 of any two directly adjacent touch regions 20 in the first direction D1 or the second direction D2 are not connected to each other. In the example of FIG. 2, the number of the connecting lines 21 is equal to the number of the touch signal lines 22, and each of the connecting lines 21 is electrically connected only to one touch signal line 22. The electrical connection between the connecting lines 21 and the touch signal lines 22 can be achieved by second vias 52, third vias 53, and second conductive connections 56. The respective touch signal lines 22 of the touch regions 20 transmit respective touch sensing signals to the touch control circuit 500 (FIG. 1) during the touch period, and the touch control circuit 500 can then identify one or more of the touch regions 20 as a touch position based on the touch sensing signals.

Figure 3:
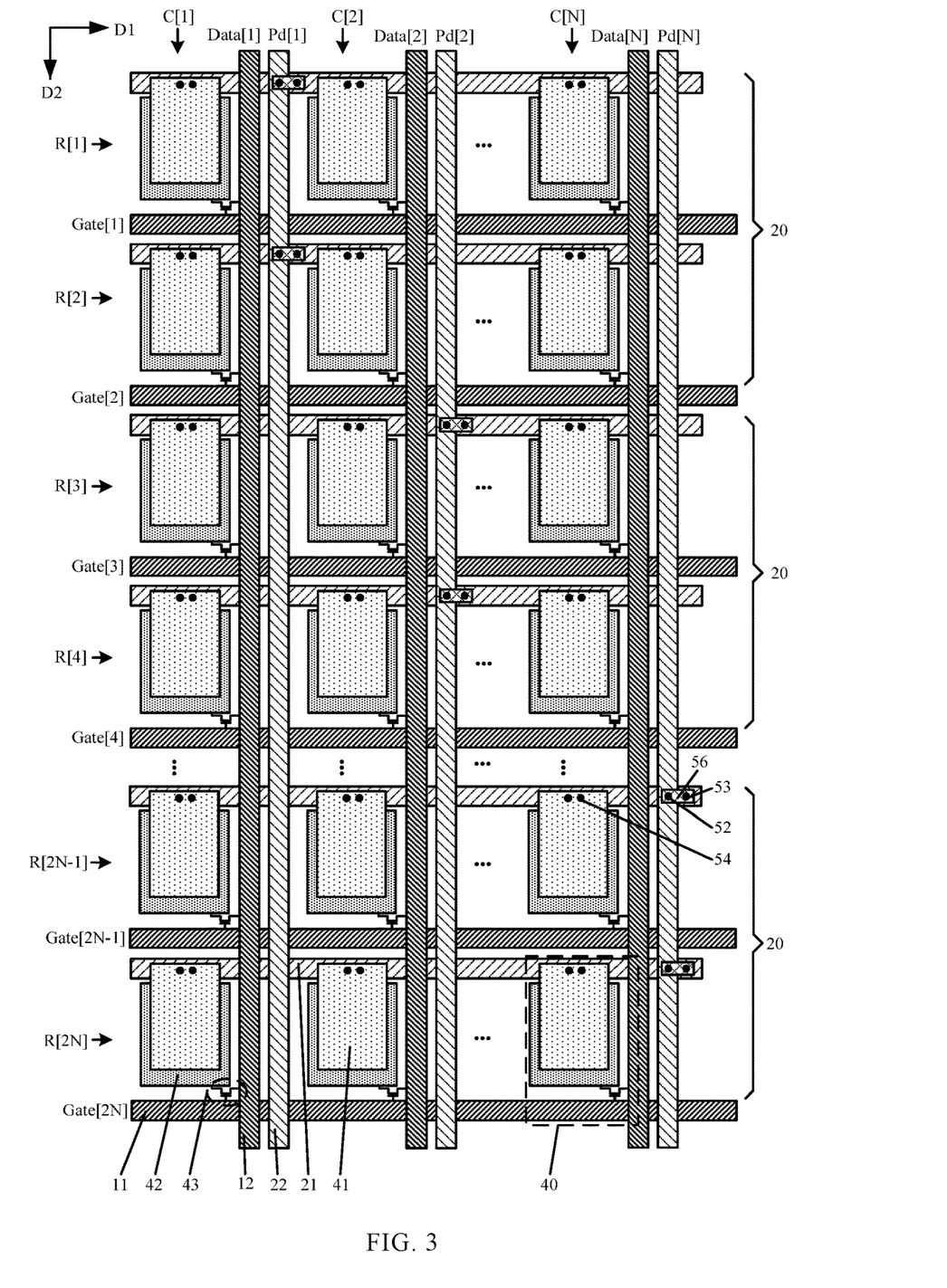
FIG. 3 is a schematic plan view showing a plurality of touch regions in a touch display panel according to an embodiment of the present disclosure.

FIG. 3 alternatively illustrates several example touch regions 20 in the touch display panel 100. Referring to FIG. 3, a plurality of gate lines Gate[1], Gate[2], Gate[3], Gate[4], . . . , Gate[2N-1], Gate[2N] extend in the first direction D1, and a plurality of data lines Data[1], Data[2], . . . , Data[N] and a plurality of touch signal lines Pd[1], Pd[2], . . . , Pd[N] extend in the second direction D2. 2N×N pixels 40 are arranged in 2N rows R[1], R[2], R[3], R[4], . . . , R[2N-1], R[2N] and N columns C[1], C[2], . . . , C[N].

In FIG. 3, N touch regions 20 arranged in the second direction D2 are shown, each of which includes two connecting lines 21 and a respective touch signal line 22. Each of the connecting lines 21 electrically connects N common electrodes 41 in the touch region 20 where it is located, and the two connecting lines 21 in the touch region 20 are electrically connected through the respective touch signal line 22. The connecting lines 21 of any two directly adjacent touch regions 20 in the first direction D1 or the second direction D2 are not connected to each other. As a result, the touch regions 20 are still independent of each other. Similar to the example shown in FIG. 2, the electrical connection between the connecting lines 21 and the common electrodes 41 is achieved by the fourth vias 54, and the electrical connection between the connecting lines 21 and the touch signal lines 22 is achieved by the second vias 52, the third vias 53 and the second conductive connections 56. It will be understood that each of the touch regions 20 may comprise three or more connecting lines 21 depending on the desired touch control accuracy, and each of the connecting lines 21 may electrically connect any suitable number of common electrodes 41 together.

Figure 4:
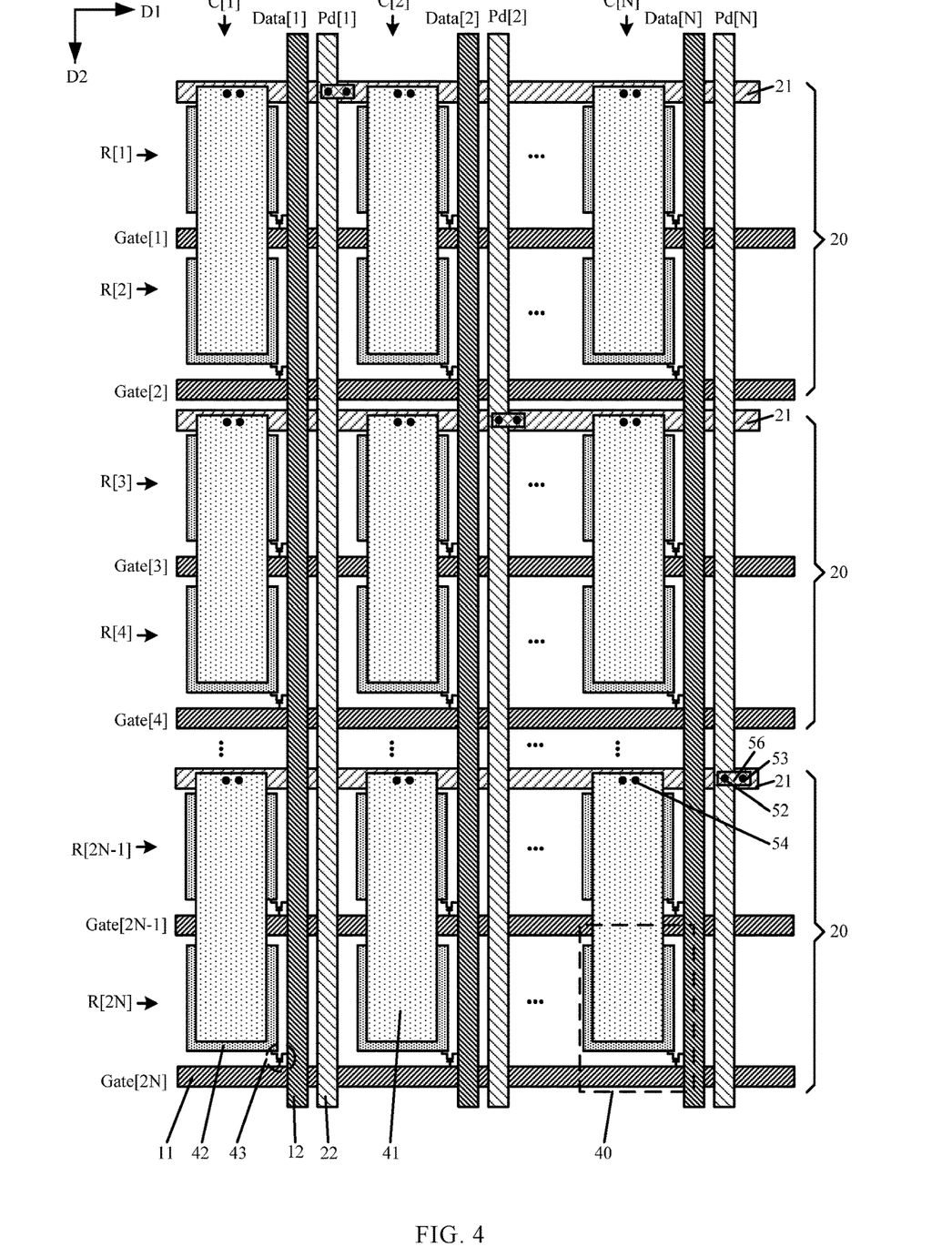
FIG. 4 is a schematic plan view showing a plurality of touch regions in a touch display panel according to an embodiment of the present disclosure.

FIG. 4 shows a variation of the touch region 20 shown in FIG. 3. Referring to FIG. 4, a plurality of gate lines Gate[1], Gate[2], Gate[3], Gate[4], . . . , Gate[2N-1], Gate[2N] extend in the first direction D1, and a plurality of data lines Data[1], Data[2], . . . , Data[N] and a plurality of touch signal lines Pd[1], Pd[2], . . . , Pd[N] extend in the second direction D2. 2N×N pixels 40 are arranged in 2N rows R[1], R[2], R[3], R[4], . . . , R[2N-1], R[2N] and N columns C[1], C[2], . . . , C[N].

Unlike the example shown in FIG. 3, in each of the touch regions 20 shown in FIG. 4, two directly adjacent common electrodes in the second direction D2 are formed together as an integral piece 41. In this case, each of the touch regions 20 may include only one connecting line 21. This allows for an increased aperture ratio of the pixels 40 by reducing the wiring space for the connecting lines 21, thereby improving the display brightness. Moreover, this reduces the resolution of the pattern of the common electrodes 41, thereby reducing the process requirements. It will be understood that in other embodiments, each of the touch regions 20 may cover three or more pixels 40 in the second direction D2, and thus three or more directly adjacent common electrodes may be formed together as an integral piece. In addition, although not shown, in each of the touch regions 20, two or more directly adjacent common electrodes 41 in the first direction D1 may also be formed together as an integral piece.

Figure 5:
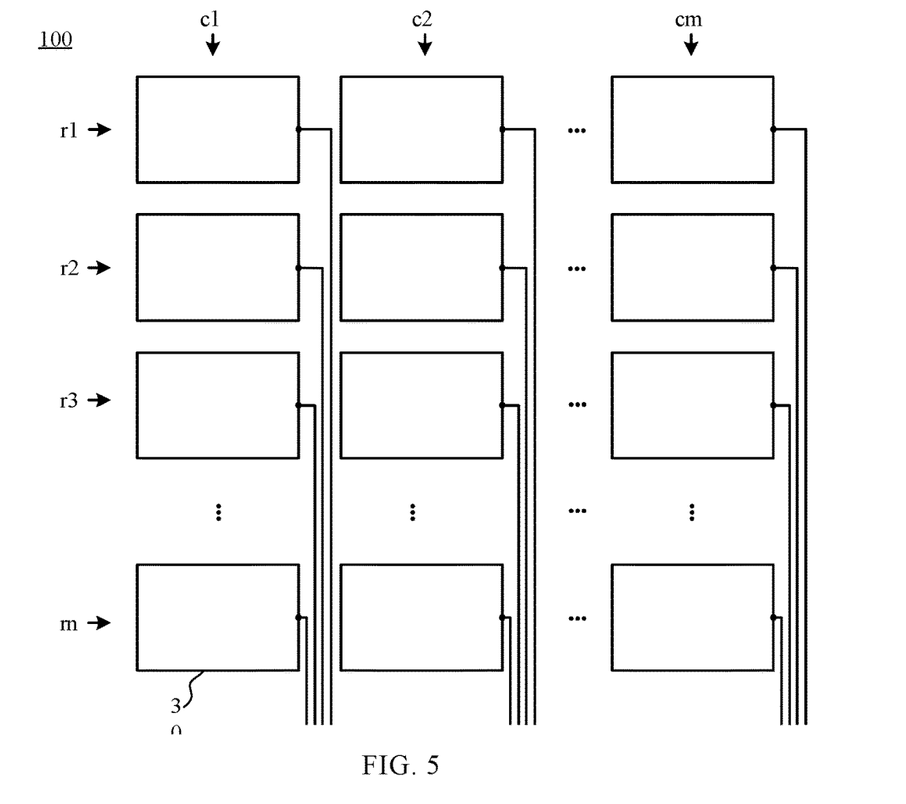
FIG. 5 is a schematic block diagram of a touch display panel according to an embodiment of the present disclosure.

FIG. 5 shows a schematic block diagram of the touch display panel 100 of FIG. 1. Referring to FIG. 5, the touch display panel 100 includes a plurality of blocks arranged in a plurality of rows r1, r2, r3, . . . , rn and a plurality of columns c1, c2, . . . , cm, each of which represents a respective touch region 20 described above with respect to FIGS. 2-4. In FIG. 5, each of these blocks is indicated by reference 30, and is hereinafter referred to as a touch sensor. The touch sensors 30 operate as self-capacitive touch sensors, each of which includes a plurality of common electrodes 41 and one or more connecting lines 21 connecting the common electrodes 41 in the touch region 20 described above with respect to FIGS. 2-4. Due to the simple arrangement of the common electrodes 41, the touch display panel 100 does not need a double-layer electrode structure or bridge structures as in a typical mutual capacitive touch sensor, and does not need a complex electrode pattern as in a typical self-capacitive touch sensor. This facilitates a simplified manufacturing process, thus saving the cost.

Figure 6:
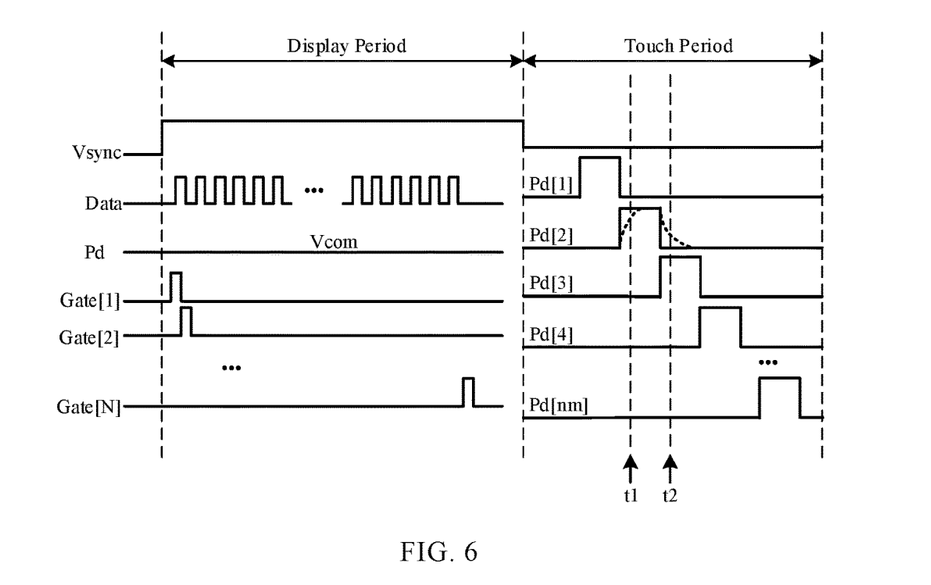
FIG. 6 is an example timing diagram of the touch display panel shown in FIG. 5.
Figure 7:
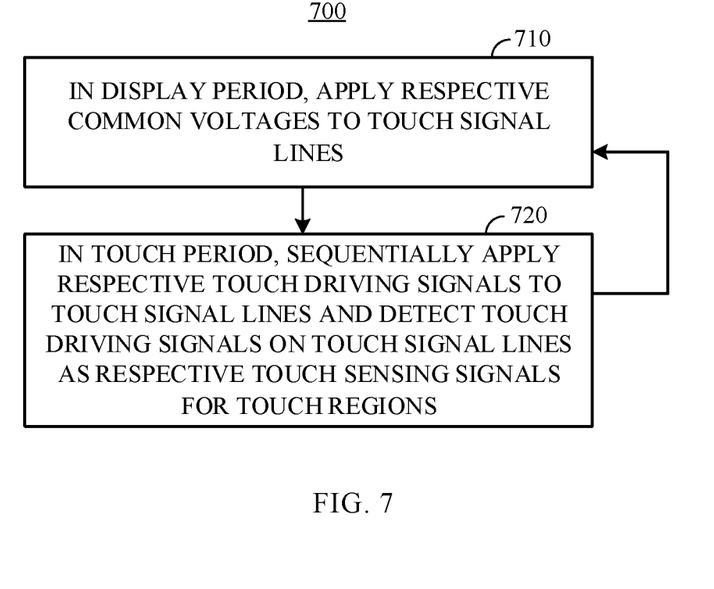
FIG. 7 is a flowchart of a method of driving a touch display panel according to an embodiment of the present disclosure.
Figure 8:
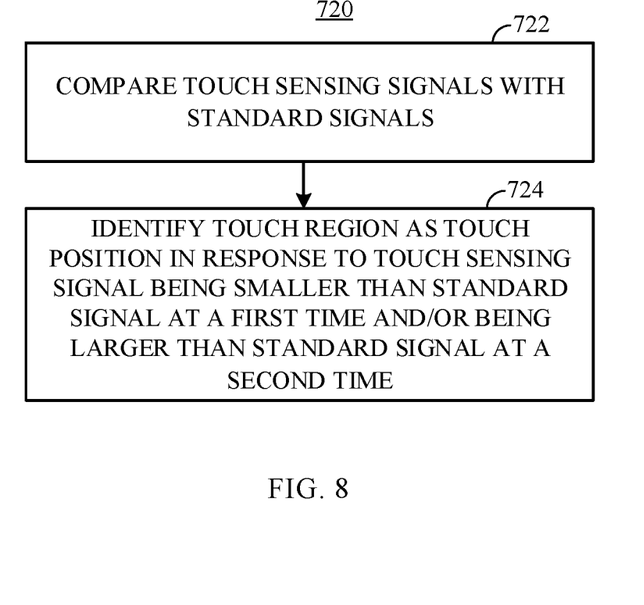
FIG. 8 is a flowchart of a method of driving a touch display panel according to an embodiment of the present disclosure.

FIG. 6 is an example timing diagram of the touch display panel 100 illustrated in FIG. 5, and FIGS. 7 and 8 are flowcharts of a method 700 of driving the touch display panel 100. The operation of the touch display panel 100 will be described below with reference to FIGS. 6-8.

An operation cycle of the touch display panel 100 includes a display period and a touch period. The display period and the touch period are alternately performed at such a frequency that the display operation and the touch operation of the touch display panel 100 are perceived by the user as being performed simultaneously. In an exemplary embodiment, one operation cycle lasts 16.67 ms, with the first 12.67 ms being the display period and the last 4 ms being the touch period.

In the display period, the touch signal lines (indicated collectively by Pd in FIG. 6) are applied with respective common voltages (step 710). Meanwhile, in a time interval in which the vertical synchronization signal Vsync is active, the gate lines Gate[1], Gate[2], . . . , Gate[N] are sequentially supplied with a gate driving signal, and the data lines (indicated collectively by Data in FIG. 6) is supplied with data voltages schematically shown as a square wave. In this way, respective electric fields are established between the common electrodes 41 and the pixel electrodes 42 of the pixels 40 (FIGS. 2-4) to drive the liquid crystal into deflection, thereby realizing the display function of the touch display panel 100. It will be understood that although the common voltages are shown in FIG. 6 as a single voltage Vcom, in other embodiments the common voltages may not be equal to each other.

In the touch period, the touch signal lines Pd[1], Pd[2], Pd[3], Pd[4], . . . , Pd[nm] are sequentially applied with a touch driving signal (e.g., a rectangular pulse) and the touch driving signals on the touch signal lines Pd[1], Pd[2], Pd[3], Pd[4], . . . , Pd[nm] are detected as respective touch sensing signals for the touch sensors 30 (or the touch regions 20) (step 720). As such, the touch sensors 30 are sequentially applied with the touch driving signal. When a touch event occurs in which a finger or a stylus touches or approaches a touch sensor 30, the capacitance between the touch sensor 30 and the ground increases, rendering the touch driving signal on the touch signal line to which the touch sensor 30 is connected different from a touch driving signal in the absence of the touch event (referred to as a standard signal). For convenience of explanation, it is assumed that the capacitance inherent to the touch sensor 30 is much smaller than the capacitance of the touch sensor 30 in the presence of a touch event, and thus, in the example shown in FIG. 6, the touch driving signals (rectangular pulses) supplied to the touch signal lines Pd[1], Pd[2], Pd[3], Pd[4], . . . , Pd[nm] are approximately considered to be standard signals. The touch sensing signals on the touch signal lines Pd[1], Pd[2], Pd[3], Pd[4], . . . , Pd[nm] are compared with the standard signals (step 722). As shown in FIG. 6, the touch sensing signal (indicated by a broken line) on the touch signal line Pd[2] is significantly changed compared to the standard signal. Specifically, the rising and falling edges of the touch sensing signal have a smaller slope than those of the standard signal due to the increased capacitance. More specifically, the touch sensing signal is smaller than the standard signal at a first time t1 and larger than the standard signal at a second time t2. In response to this, the touch sensor 30 (or the touch region 20) connected to the touch signal line Pd[2] is identified as a touch position (step 724).

Figure 9:
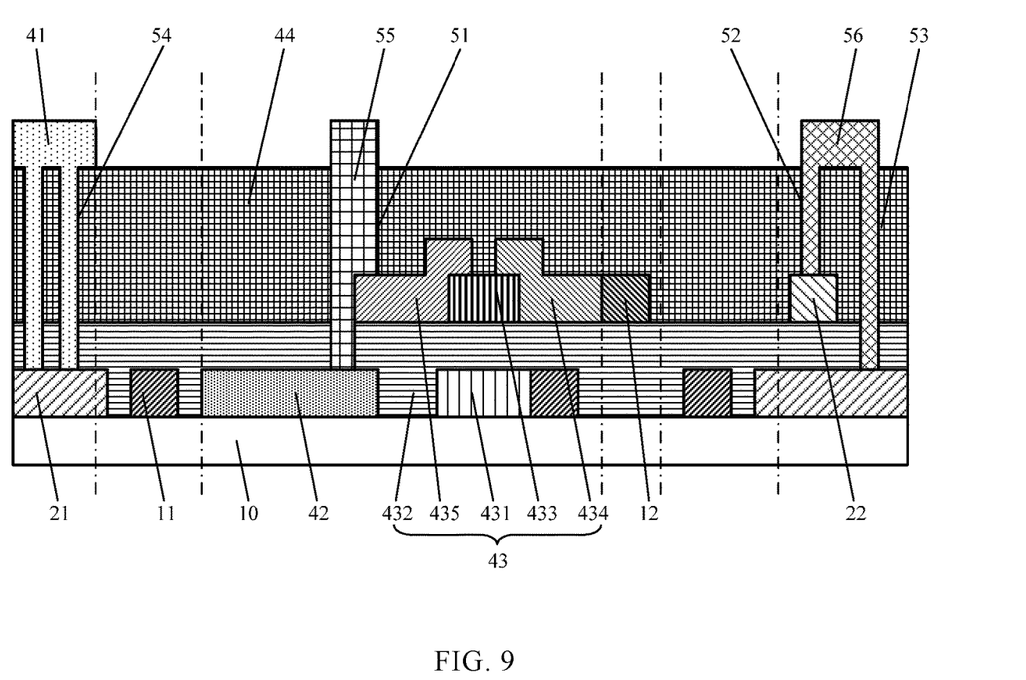
FIG. 9 is a cross-sectional view taken along line A-A of FIG. 2.
Figure 10:
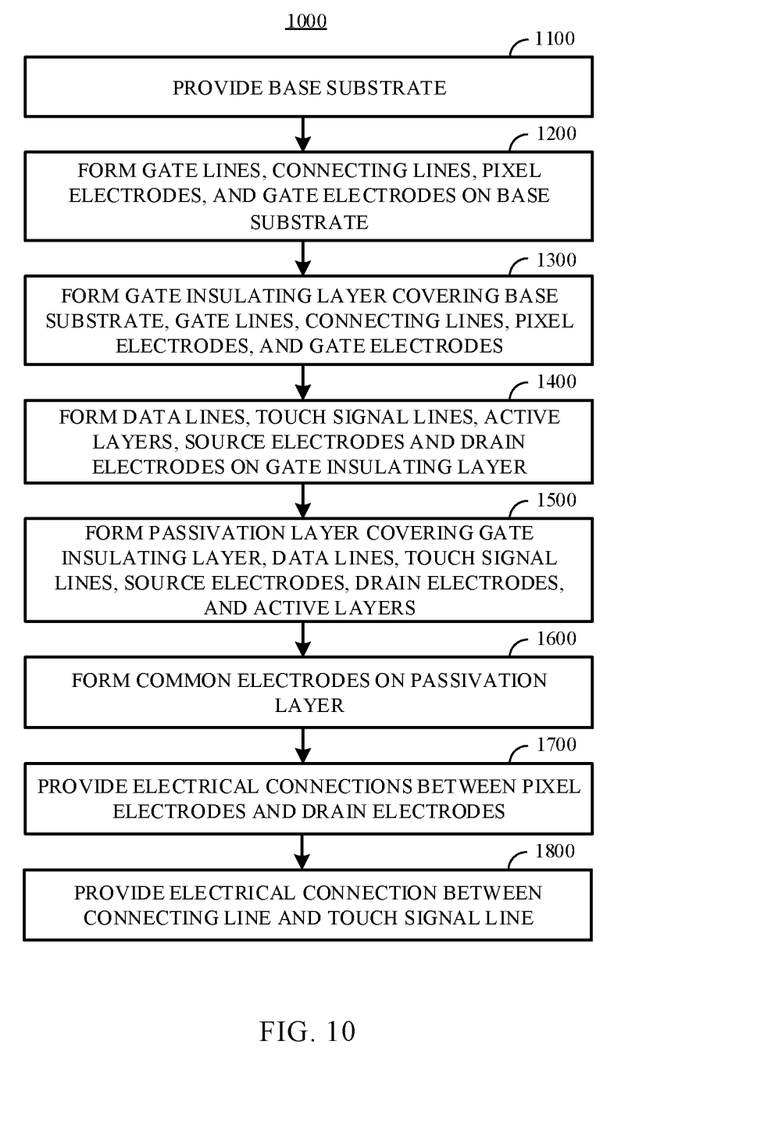
FIG. 10 is a flowchart of a method of manufacturing a touch display panel according to an embodiment of the present disclosure.

FIG. 9 shows a cross-sectional view taken along line A-A of FIG. 2, and FIG. 10 shows a flow chart of a method 1000 of manufacturing the touch display panel 100 in accordance with an embodiment of the present disclosure. The structure and manufacture of the touch display panel 100 will be further described below with reference to FIGS. 9 and 10.

As shown in FIG. 9, the connecting line 21, the gate line 11, the pixel electrode 42, and the thin film transistor 43 are located on the base substrate 10. The thin film transistor 43 includes a gate electrode 431, a gate insulating layer 432, an active layer 433, a source electrode 434, and a drain electrode 435. The gate electrode 431 is directly on the base substrate 10 and disposed in the same layer as the gate line 11. The gate electrode 431 is connected to the gate line 11. The gate insulating layer 432 covers the base substrate 10, the pixel electrode 42, the gate electrode 431, the gate line 11, and the connecting line 21. The active layer 433 is disposed on the gate insulating layer 432 and opposite to the gate 431. The source electrode 434 and the drain electrode 435 are in contact with the active layer 433 and are disposed in the same layer as the data line 12. The source electrode 434 is connected to the data line 12, and the drain electrode 435 is connected to the pixel electrode 42. The touch signal line 22 is disposed in the same layer as the data line 12. A passivation layer 44 covers the gate insulating layer 432, the source electrode 434, the drain electrode 435, the data line 12, and the touch signal line 22. The common electrode 41 is disposed on the passivation layer 44.

FIG. 9 further shows a first via 51, a second via 52, a third via 53, two fourth vias 54, a first conductive connection 55 and a second conductive connection 56. The first via 51 extends through the passivation layer 44 and the gate insulating layer 432 to expose the pixel electrode 42 and the drain electrode 435. The first via 51 is filled by the first conductive connection 55 such that the drain electrode 435 and the pixel electrode 42 are electrically connected through the first conductive connection 55. The second via 52 extends through the passivation layer 44 to expose the touch signal line 22. The third via 53 extends through the passivation layer 44 and the gate insulating layer 432 to expose the connecting line 21. The second via 52 and the third via 53 are filled by the second conductive connection portion 56 such that the connecting line 21 and the touch signal line 22 are electrically connected through the second conductive connection portion 56. The first conductive connection 55 and the second conductive connection 56 can be made of any suitable electrically conductive material. The two fourth vias 54 extend through the passivation layer 44 and the gate insulating layer 432 to expose the connecting line 21. The fourth via 54 is filled with the common electrode 41 such that the common electrode 41 is electrically connected to the connecting line 21. The presence of the two fourth via holes 54 can improve the reliability of the electrical connection between the common electrode 41 and the connecting line 21. In other embodiments, the common electrode 41 can be electrically connected to the connecting line 21 by fewer or more fourth vias 54.

In manufacturing the touch display panel 100, after the base substrate 10 is provided (step 1100), the gate line 11, the connecting line 21, the pixel electrode 42, and the gate electrode 431 associated with the pixel electrode 42 are formed on the base substrate 10 (step 1200). For example, a pixel electrode material (e.g., indium tin oxide, ITO) layer may be first deposited on the base substrate 10, and the pixel electrode 42 is formed using a mask. Then, a gate line material layer is deposited on the base substrate 10, and the gate line 11, the connecting line 21, and the gate electrode 431 electrically connected to the gate line 11 are formed using a mask. In some embodiments, the connecting line 21 can be formed separately. Alternatively, the connecting line 21 may be formed with the gate line 11 by a one-time patterning process, thereby simplifying the manufacturing process and reducing the required mask. Next, the gate insulating layer 432 is formed (step 1300). The gate insulating layer 432 covers the base substrate 10, the pixel electrode 42, the gate line 11, the connecting line 21, and the gate electrode 431. Then, the active layer 433 disposed opposite to the gate electrode 431, the source 434 and drain 435 in contact with the active layer, the data line 12, and the touch signal line 22 are formed on the gate insulating layer 432 (Step 1400). For example, an active layer material layer is deposited on the gate insulating layer 432, and the active layer 433 is formed directly above the gate electrode 431 using a mask; then a data line material layer is deposited, and the data line 12, the touch signal line 22, the source electrode 434 and the drain electrode 435 are formed simultaneously with a halftone mask (HTM). The source electrode 434 is electrically coupled to the data line 12. The touch signal line 22 and the data line 12 can be formed by a one-time patterning process, thereby simplifying the manufacturing process and reducing the required mask. Alternatively, the touch signal line 22 may be formed independently of the data line 12. Next, the passivation layer 44 is formed (step 1500), which covers the gate insulating layer 432, the data line 12, the touch signal line 22, the source electrode 434, the drain electrode 435, and the active layer 433. The common electrode 41 is formed on the passivation layer 44, opposite to the pixel electrode 42 (step 1600). The common electrode 41 is electrically connected to the connecting line 21. For example, the fourth via 54 is formed which extends through the passivation layer 44 and the gate insulating layer 432 to expose the connecting line 21, and the fourth via hole 54 is filled with the common electrode 21 to provide an electrical connection between the common electrode 41 and the connecting line 21. Referring back to FIGS. 2-4, the touch display panel 100 includes multiple common electrodes 41 distributed in the plurality of touch regions 20 arranged in an array and independent of each other. Each of the touch regions 20 further includes at least one connecting line 21, each of which electrically connects respective ones of the common electrodes 41 together. In some embodiments, at least two directly adjacent ones of the common electrodes 41 are formed together as an integral piece (FIG. 4) in each of the touch regions 20. An electrical connection between the pixel electrode 41 and the drain electrode 435 is provided (step 1700). For example, the first via 51 is formed which extends through the passivation layer 44 and the gate insulating layer 432 to expose the pixel electrode 41 and the drain electrode 435, and the first via 51 is filled with the first conductive connection 55 to electrically connect the pixel electrode 41 and drain electrode 435. An electrical connection between the connecting line 21 and the touch signal line 22 is provided (step 1800). For example, the second via 52 and the third via 53 are formed at the intersection of the connecting line 21 and the touch signal line 22. The second via 52 extends through the passivation layer 44 to expose the touch signal line 22, and the third via 43 extends through the passivation layer 44 and the gate insulating layer 432 to expose the connecting line 21. Then, the second via 52 and the third via 53 are filled and electrically connected by the second conductive connection 56.

It will be understood that steps 1600-1800 are not necessarily performed in the order in which they are illustrated and described. In some embodiments, the first via 51, the second via 52, the third via 53, and the fourth via 54 may be simultaneously formed by a one-time patterning process, thereby simplifying the manufacturing process and reducing the required mask. Then, a common electrode material (for example, ITO) layer is deposited, and the common electrode 41, the first conductive connection portion 55, and the second conductive connection portion 56 are simultaneously formed using a mask. The second conductive connection 56 may include a first portion filling the second via 52 and electrically connected to the touch signal line 22, a second portion filling the third via hole 53 and electrically connected to the touch signal line 22, and a bridge portion located on the passivation layer 44 and connected to the first portion and the second portion. In the example shown in FIG. 9, the common electrode 41 is electrically connected to the connecting line 21 through the two fourth vias 54, thereby improving the reliability of the electrical connection between the common electrode 41 and the connecting line 21. Alternatively, the common electrode 41 may be electrically connected to the connecting line 21 through fewer or more fourth vias 54.

While the previous discussion contains a number of specific implementation details, these should not be construed as limiting the scope of the claimed subject matter, but rather to the description of features that may be limited to the specific embodiments. The specific features described in the different embodiments of the specification can also be implemented in combination in a single embodiment. In contrast, different features that are described in a single embodiment can be implemented in various embodiments, respectively, or in any suitable sub-combination. Similarly, although the various operations are depicted in the drawings in a particular order, this should not be construed as requiring that the operations must be performed in the particular order shown or in a sequential order, or that all of the operations shown must be performed to achieve the desired result. In some cases, parallel processing may be advantageous.

The foregoing is specific embodiments of the present disclosure, and the scope of the present disclosure is not limited thereto. Various changes or substitutions can be made by those skilled in the art without departing from the scope of the disclosure. The scope of the disclosure, therefore, is intended to be defined by the appended claims and equivalents thereof.

What is claimed is:

1. A touch display panel, comprising:
   a plurality of gate lines extending in a first direction;
   a plurality of data lines extending in a second direction intersecting the first direction; and
   a plurality of pixels at intersections of the gate lines and the data lines, each of the plurality of pixels comprising a respective pixel electrode and a respective common electrode opposite to the pixel electrode, the common electrodes being distributed in a plurality of touch regions that are arranged in an array and independent of each other, wherein each of the plurality of touch regions comprises at least one respective connecting line extending in the first direction and a respective touch signal line electrically connected to the at least one respective connecting line and extending in the second direction, wherein each of the at least one respective connecting line electrically connects together respective ones of the common electrodes, and wherein the connecting lines are in a first layer with the gate lines, and wherein the touch signal lines are in a second layer with the data lines, wherein each of the plurality of touch regions comprises a plurality of the connecting lines, wherein within each of the plurality of touch regions at least two directly adjacent ones of the common electrodes are formed together as an integral piece, wherein the connecting lines are equal in quantity to the touch signal lines, and wherein each of the connecting lines is electrically connected to a respective one of the touch signal lines.

2. The touch display panel of claim 1, further comprising:
a base substrate on which the pixel electrodes are;
a plurality of thin film transistors at the intersections of the gate lines and the data lines, each of the plurality of thin film transistors comprising:
  a gate electrode on the base substrate and in the same layer as the gate lines, the gate electrode being electrically connected to a corresponding one of the gate lines;
  a gate insulating layer covering the base substrate, the pixel electrodes, the gate electrode, the gate lines, and the connecting lines;
  an active layer on the gate insulating layer and opposite to the gate electrode;
  a source electrode in contact with the active layer and in the same layer as the data lines, the source electrode being electrically connected to a corresponding one of the data lines; and
  a drain electrode in contact with the active layer and in the same layer as the data lines, the drain electrode being electrically connected to a respective one of the pixel electrodes; and
a passivation layer covering the gate insulating layer, the source electrode, the drain electrode, the data lines, and the touch signal lines,
wherein the common electrodes are on the passivation layer.

3. The touch display panel of claim 2, further comprising:
a plurality of first vias, each extending through the passivation layer and the gate insulating layer to expose a respective one of the pixel electrodes and a respective one of the drain electrodes;
a plurality of first conductive connections, each filling a respective one of the plurality of first vias to electrically connect a respective one of the pixel electrodes and a respective one of the drain electrodes;
a plurality of second vias, each extending through the passivation layer to expose a corresponding one of the touch signal lines;
a plurality of third vias, each extending through the passivation layer and the gate insulating layer to expose a respective one of the connecting lines;
a plurality of second conductive connections, each filling a respective one of the second vias and a respective one of the third vias to electrically connect a corresponding one of the touch signal lines and a respective one of the connecting lines; and a plurality of fourth vias, each extending through the passivation layer and the gate insulating layer to expose a corresponding one of the connecting lines, each of the plurality of fourth vias being filled by a corresponding one of the common electrodes to provide an electrical connection between the corresponding one of the common electrodes and the corresponding one of the connecting lines.

4. The touch display panel of claim 3, wherein each of the common electrodes is electrically connected to a corresponding one of the connecting lines by at least two respective ones of the fourth vias.

5. A touch display device comprising the touch display panel of claim 1.

6. The touch display device of claim 5, wherein each of the plurality of touch regions comprises a plurality of the connecting lines.

7. The touch display device of claim 5, wherein within each of the plurality of touch regions at least two directly adjacent ones of the common electrodes are formed together as an integral piece.

8. A method of driving a touch display panel, the touch display panel comprising a plurality of gate lines; a plurality of data lines intersecting the gate lines; and a plurality of pixels at intersections of the gate lines and the data lines, each of the pixels comprising a respective pixel electrode and a respective common electrode opposite to the respective pixel electrode, the common electrodes being distributed in a plurality of touch regions arranged in an array and independent of each other, each of the touch regions comprising at least one respective connecting line extending in a direction parallel to the gate lines and a respective touch signal line electrically connected to the at least one respective connecting line and extending in a direction parallel to the data lines, each of the at least one respective connecting line electrically connecting respective ones of the common electrodes together, the connecting lines being in a first layer with the gate lines, and the touch signal lines being in a second layer with the data lines, the method comprising:
performing alternately a display period and a touch period,
wherein in the display period, applying respective common voltages to the touch signal lines, and
wherein in the touch period, sequentially applying respective touch driving signals to the touch signal lines and detecting the respective touch driving signals on the touch signal lines as respective touch sensing signals for respective ones of the touch regions.

9. The method of claim 8, further comprising identifying one of the touch regions as a touch position in response to detection of a change in the touch sensing signal for the touch region relative to a standard signal.

10. The method of claim 9, wherein the change comprises at least one selected from a group consisting of the touch sensing signal being less than the standard signal at a first time and the touch sensing signal being greater than the standard signal at a second time.

* * * * *